(12) United States Patent
Maeda (10) Patent No.: US 7,858,534 B2
(45) Date of Patent: Dec. 28, 2010

(54) SEMICONDUCTOR DEVICE MANUFACTURING METHOD AND SUBSTRATE PROCESSING APPARATUS (75) Inventor: Kiyohiko Maeda, Inizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 21 days.

(21) Appl. No.: 12/187,644

(22) Filed: Aug. 7, 2008

(65) Prior Publication Data

US 2009/0042408 A1 Feb. 12, 2009

(30) Foreign Application Priority Data

Aug. 10, 2007 (JP) .............................. 2007-208798

(51) Int. Cl.
*H01L 21/31* (2006.01)
*H01L 21/469* (2006.01)

(52) U.S. Cl. ...................... 438/778; 438/787; 438/791; 257/E21.278

(58) Field of Classification Search ................. 438/778, 438/787, 791, FOR. 395, FOR. 401; 118/715; 257/E21.278
See application file for complete search history.

(56) References Cited

U.S. PATENT DOCUMENTS

| | | | |
|---|---|---|---|
| 7,122,085 B2* | 10/2006 | Shero et al. | 118/726 |
| 2002/0170674 A1* | 11/2002 | Shapiro | 156/345.33 |
| 2004/0250773 A1* | 12/2004 | Hasegawa et al. | 118/724 |
| 2005/0072357 A1* | 4/2005 | Shero et al. | 118/715 |
| 2007/0079525 A1* | 4/2007 | Sogard | 34/275 |
| 2009/0218045 A1* | 9/2009 | Hiroshima et al. | 156/345.48 |

* cited by examiner

*Primary Examiner*—Michelle Estrada
(74) *Attorney, Agent, or Firm*—Kratz, Quintos & Hanson, LLP (57) ABSTRACT A semiconductor device manufacturing method comprises a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle including a step of flowing the film forming gas from one end towards the other end along the substrate array direction, and a step of flowing the film forming gas from the other end towards the one end along the substrate array direction, without forming temperature gradient along the substrate array direction in the processing chamber.

3 Claims, 5 Drawing Sheets

SEMICONDUCTOR DEVICE MANUFACTURING METHOD AND SUBSTRATE PROCESSING APPARATUS

BACKGROUND ART

1. Technical Field

The present invention relates to a substrate processing apparatus and a semiconductor device manufacturing method. The present invention is for example effectively utilized in oxidization devices, diffusion devices, annealing devices or CVD apparatus for forming an insulating film, metallic film, or semiconductor film on a semiconductor wafer (hereinafter called "wafer") on which semiconductor integrated circuits (hereinafter called "IC") are formed.

2. Description of Related Art

The batch type vertical hot wall CVD apparatus (hereinafter called "CVD apparatus") is widely used in the IC manufacturing field for forming silicon nitride ($Si_3N_4$) films on multiple wafers.

Conventional CVD apparatus of this type contain the following type of processing furnace.

Namely, the processing furnace includes an inner tube that forms the processing chamber, and an outer tube is installed concentrically on the outer side of the inner tube. A manifold is installed on the bottom end of the outer tube. A nozzle for supplying gas into the bottom end of the process chamber, and an exhaust pipe connecting to the tubular space between the inner tube and the outer tube, are connected to the manifold. A heater is installed on the outer side of the outer tube. The heater heats the interior of the processing chamber to a specified temperature distribution.

During forming of a film in the processing furnace by this CVD apparatus, a boat holding multiple wafers is loaded into the processing chamber from the bottom end opening of the manifold, and a seal cap seals the bottom end opening of the manifold air-tight, and a nozzle supplies a process gas such as chlorosilane gas and ammonia gas as well as other gases into the bottom end section within the processing chamber.

The process gas supplied into the bottom end within the processing chamber, makes contact with the wafer group from below, and rises within the processing chamber while forming a film by the thermal CVO reaction, flows from the top end opening of the inner tube into the tubular space and is exhausted through an exhaust pipe connected to the bottom end section of the tubular space.

The film forming rate is dependent on the gas flow at this time, so that the film on the wafer placed at the bottom side of the boat tends to be thicker than the film on the wafer placed on the top side of the boat.

In the prior art, the control is performed so that the heater forms a temperature gradient within the processing chamber in order to eliminate this difference in film thickness among the wafers so that the film thickness among the wafers is uniform along the entire length of the boat.

SUMMARY OF INVENTION

However, in film forming where a temperature gradient is formed within the processing chamber, differences in film quality such as in refractive index and etching rate occur between the film formed on wafers positioned on the top side of the boat and the film formed on wafers positioned on the bottom side of the boat.

An object of the present invention is to provide a substrate processing apparatus and a semiconductor device manufacturing method capable of preventing the occurrence of differences in film thickness among substrates for processing, while also preventing the occurrence of differences in film quality such as in refractive index and etching rate among substrates for processing.

Representative aspects of the present invention for resolving the aforementioned problems are described next.

(1) A semiconductor device manufacturing method comprising a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle including a step of flowing the film forming gas from one end towards the other end along the substrate array direction, and a step of flowing the film forming gas from the other end towards the one end along the substrate array direction, without forming temperature gradient along the substrate array direction in the processing chamber.

(2) A semiconductor device manufacturing method comprising a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle including a film forming step where the concentration of the film forming gas or pressure in the processing chamber becomes lower from one end towards the other end along the substrate array direction, and a film forming step where the concentration of the film forming gas or pressure in the processing chamber becomes lower from the other end towards the one end along the substrate array direction.

(3) A semiconductor device manufacturing method comprising a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle including a film forming step where the thicknesses of the films formed on the substrates become thinner from one end towards the other end along the substrate array direction, and a film forming step where the thicknesses of the films formed on the substrates become thinner from the other end towards the one end along the substrate array direction.

(4) A substrate processing apparatus comprising:

a processing chamber for processing substrates, a support jig for holding the multiple substrates in the processing chamber, a heater for heating the interior of the processing chamber, a first gas supply section for supplying a film forming gas from one end side along the substrate array direction in the processing chamber, a first gas exhaust section for exhausting the interior of the processing chamber from the other end side along the substrate array direction in the processing chamber, a second gas supply section for supplying the film forming gas from the other end side along the substrate array direction in the processing chamber, a second gas exhaust section for exhausting the interior of the processing chamber from the one end side along the substrate array direction in the processing chamber, and a controller for controlling to perform a cycle one time or multiple times with one cycle including flowing the film forming gas from the one end side towards the other end side along the substrate array direction, and flowing the film forming gas from the other end side towards the one end side along the substrate array direction, without forming temperature gradient along the substrate array direction in the processing chamber.

(5) The semiconductor device manufacturing method according to the above first (1) aspect, comprising a purge step of purging the interior of the processing chamber between the step of flowing the film forming gas from the one end towards the other end along the substrate array direction, and the step of flowing the film forming gas from the other end towards the one end along the substrate array direction, wherein the film forming gas contains dichlorosilane gas and ammonia gas, and the purge step is performed under an ammonia gas atmosphere.

(6) The semiconductor device manufacturing method according to the above first (1) aspect, comprising a purge step of purging the interior of the processing chamber between the step of flowing the film forming gas from the one end towards the other end along the substrate array direction, and the step of flowing the film forming gas from the other end towards the one end along the substrate array direction, wherein the film forming gas contains dichlorosilane gas and ammonia gas, and the purge step is performed utilizing ammonia gas.

(7) The semiconductor device manufacturing method according to the above first (1) aspect, wherein the film forming gas contains dichlorosilane gas and ammonia gas, and ammonia gas is supplied continuously without stopping, while switching the flow of the film forming gas from the one end towards the other end along the substrate array direction, to the flow from the other end towards the one end along the substrate array direction, or switching the flow of the film forming gas from the other end towards the one end along the substrate array direction, to the flow from the one end towards the other end along the substrate array direction.

The above aspects are capable of improving both the film quality uniformity (refractive index of film, etching rate) among the substrates and the film thickness uniformity among the substrates.

The above aspects are capable of forming one continuous film by controlling so that no interface is formed at the switching time of the gas flow.

DETAILED DESCRIPTION OF PREFERRED EMBODIMENTS

An embodiment of the present invention is described next while referring to the drawings.

In the present embodiment, the substrate processing apparatus of the present invention is a CVD apparatus (batch type vertical hot wall decompression CVD apparatus) for implementing the film forming process in an IC production method.

Figure 1:
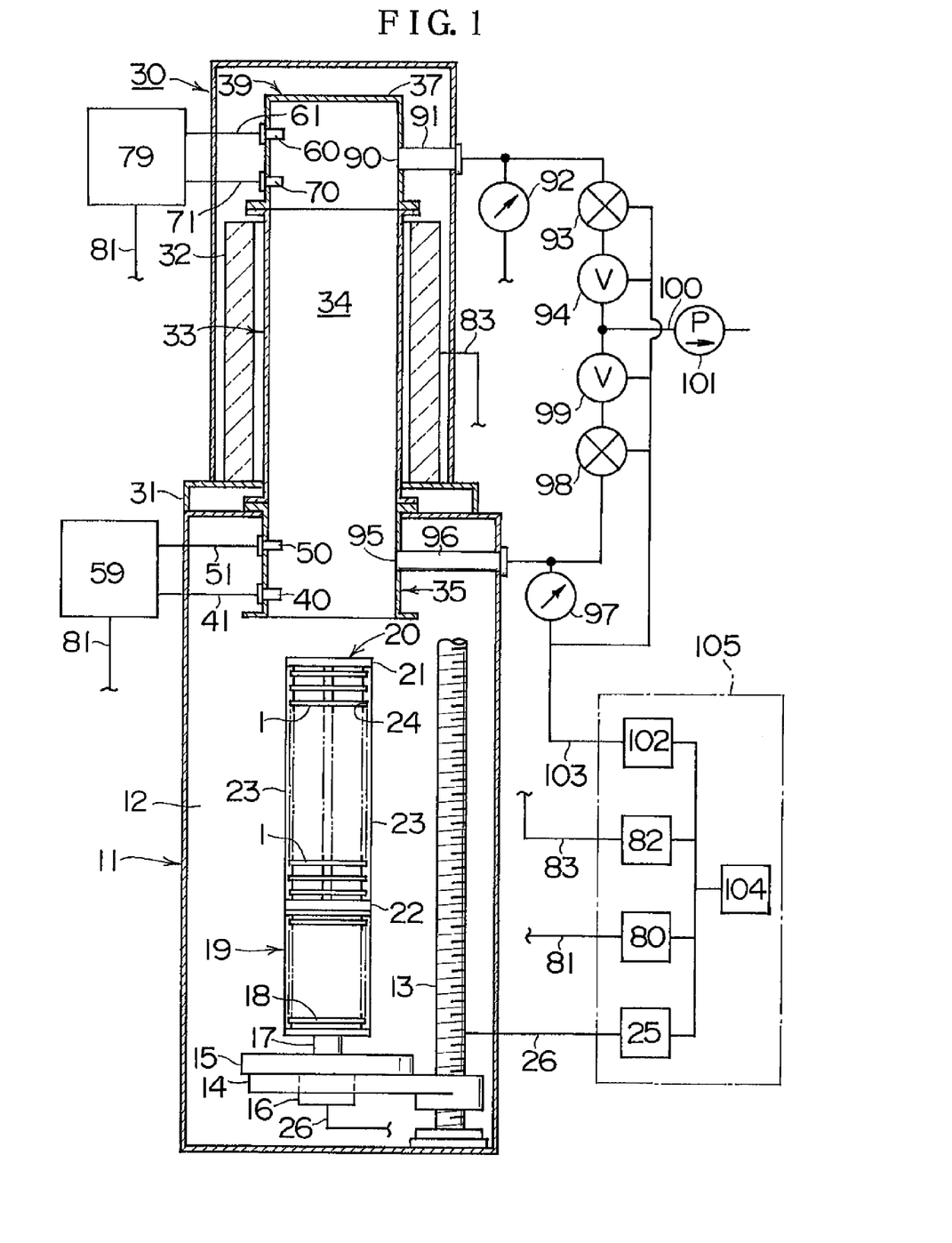
FIG. 1 is a front cross sectional view showing the CVD apparatus of an embodiment of the present invention.

A CVD apparatus 10 of this embodiment as shown in FIG. 1 includes a case 11 forming a standby chamber 12 serving as a pre-processing chamber. The case 11 is formed in a rectangular parallelpiped box shape.

A boat elevator 13 is installed inside the standby chamber 12. An arm 14 for raising and lowering the boat elevator 13 horizontally supports a seal cap 15.

A swivel mechanism 16 is installed on the lower surface of the seal cap 15. A swivel shaft 17 of the swivel mechanism 16 passes through the seal cap 15. A boat 20 is installed on the upper edge of the swivel shaft 17 by way of a heat insulating plate holder 19 holding a heat insulating plate 18.

The heat insulating plate 18 is formed in a disk shape using a heat-resistant material such as quartz or silicon carbide. The heat insulating plate 18 prevents heat from the heater (described later) from easily propagating to the lower manifold (described later) side.

The boat 20 serving as the support jig is formed in long, cylindrical shape as viewed overall and made using multiple support rods 23 and end plates 21, 22 at top and bottom made from a heat-resistant material such as quartz or silicon carbide. Many slots (holding grooves) 24 (See FIG. 2) are arrayed at equidistant spaces (perpendicularly) along the length of the support rods 23.

Figure 2:
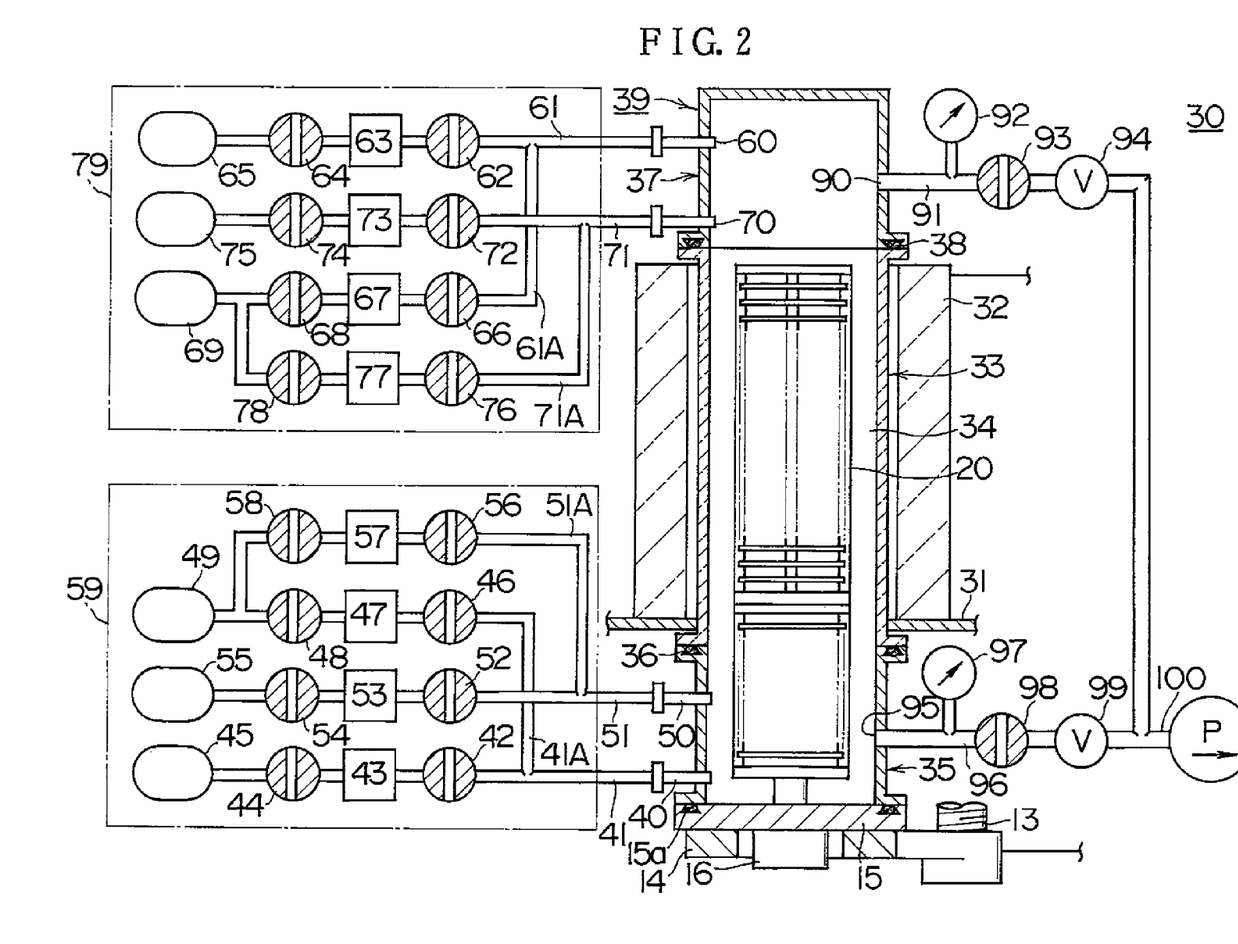
FIG. 2 is a drawing for showing the processing furnace.

By simultaneously inserting the edges of the wafer 1 into the multiple slots 24 on one level, the boat 20 can support the multiple wafers 1 at multiple levels, horizontally and with their centers aligned.

A drive control unit 25 connects electrically by way of an electrical wire 26 to the swivel mechanism 16 and the boat elevator 13. The drive control unit 25 controls the swivel mechanism 16 and the boat elevator 13 to perform the desired operation at the desired timing.

A processing furnace 30 is installed on the case 11 as shown in FIG. 1.

The processing furnace 30 contains a heater 32 serving as the heater mechanism. The heater 32 is a tubular shape and is installed perpendicularly and supported by a heater base 31 serving as the support plate.

A process tube 33 as a reaction tube is installed concentrically with the heater 32 on the inner side of the heater 32. A heat resistant material such as quartz ($SiO_2$) or silicon carbide (SiC) is utilized as the process tube 33 material. The process tube 33 is formed in a tubular shape open at the top end and the bottom end.

A processing chamber 34 is formed by a hollow space inside the process tube 33. This processing chamber 34 is structured to store the boat 20 holding the wafers 1 serving as the substrate horizontally in multiple vertical stages.

As shown in FIG. 2, a lower manifold 35 is installed concentrically with the process tube 33 on the lower side of the process tube 33. The lower manifold 35 is made from stainless steel or quartz, and is formed in a tubular shape open at the top end and the bottom end.

The lower manifold 35 engages with the process tube 33. The lower manifold 35 is structured to support the process tube 33.

An O-ring 36 is installed as a sealing member between the lower manifold 35 and the process tube 33. The process tube 33 is installed perpendicularly since the lower manifold 35 is supported by the heater base 31.

An upper manifold 37 is installed concentrically with the process tube 33 on the upper side of the process tube 33. The upper manifold 37 is made from quartz or stainless steel, and is formed in a tubular shape open on the bottom end and closed on the top end.

The upper manifold 37 engages with the process tube 33, an is supported by the process tube 33.

An O-ring 38 is installed as a sealing member between the process tube 33 and the upper manifold 37.

A reaction container 39 is formed from the process tube 33, the lower manifold 35 and the upper manifold 37.

A first lower nozzle 40 and a second lower nozzle 50 serving as lower gas feed units connect to the lower manifold 35, and each connects to the interior of the processing chamber 34. A first gas supply pipe 41 and a second gas supply pipe 51 respectively connect to the first lower nozzle 40 and the second lower nozzle 50.

A first process gas supply source 45 for supplying a first process gas is connected to the upper flow side which is opposite the side connecting to the first lower nozzle 40 of the first gas supply pipe 41 by way of a valve 42, an MFC (mass flow controller) 43 serving as the gas flow rate controller, and a valve 44.

An inert gas supply pipe 41A connects to the lower flow side of the valve 42 of the first gas supply pipe 41. An inert gas supply source 49 is connected to supply inert gas to the inert gas supply pipe 41A by way of a valve 46, a MFC 47, and a valve 48.

A second process gas supply source 55 for supplying a second process gas connects by way of a valve 52, a MFC 53 and a valve 54, to the upper flow side which is opposite the side connecting to the second lower nozzle 50 of the second gas supply pipe 51.

An inert gas supply pipe 51A connects to the lower flow side of the valve 52 of the second gas supply pipe 51. The inert gas supply pipe 51A connects by way of a valve 56, a MFC 57 and a valve 58, to the inert gas supply source 49 for supplying inert gas.

A first process gas supply line is made up of the above described first lower nozzle 40, first gas supply pipe 41, valve 42, MFC 43, valve 44, and the first process gas supply source 45, etc. A second process gas supply line is made up of the second lower nozzle 50, second gas supply pipe 51, valve 52, MFC 53, valve 54, and the second process gas supply source 55, etc.

A first gas supply section 59 is made up of the first gas supply pipe 41, valve 42, MFC 43, valve 44 and the first process gas supply source 45 of the first process gas supply line; and the second gas supply pipe 51, valve 52, MFC 53, valve 54 and the second process gas supply source 55 of the second process gas supply line.

A first upper nozzle 60 and a second upper nozzle 70 serving as the upper gas feed units connect to the upper manifold 37, and each connects to the interior of the processing chamber 34. A first gas supply pipe 61 and a second gas supply pipe 71 respectively connect to the first upper nozzle 60 and the second upper nozzle 70.

A first process gas supply source 65 for supplying a first process gas connects by way of a valve 62, a MFC 63, and a valve 64, to the upper flow side which is opposite the side connecting with the first upper nozzle 60 of the first gas supply pipe 61.

An inert gas supply pipe 61A is connected to the lower flow side of the valve 62 of the first gas supply pipe 61. An inert gas supply source 69 for supplying inert gas connects by way of a valve 66, a MFC 67 and a valve 68 to the inert gas supply pipe 61A.

A second process gas supply source 75 for supplying a second process gas connects by way of a valve 72, a MFC 73, and a valve 74, to the upper flow side which is opposite the side connecting with the second upper nozzle 70 of the second gas supply pipe 71.

An inert gas supply pipe 71A connects to the lower flow side of the valve 72 of the second gas supply pipe 71. The inert gas supply pipe 71A connects by way of a valve 76, a MFC 77 and a valve 78 to the inert gas supply source 69 for supplying inert gas.

A first process gas supply line is made up of the above described first upper nozzle 60, first gas supply pipe 61, valve 62, MFC 63, valve 64 and the first process gas supply source 65, etc. A second process gas supply line is made up of the second upper nozzle 70, second gas supply pipe 71, valve 72, MFC 73, valve 74, and the second process gas supply source 75, etc.

A second gas supply section 79 is made up of the first gas supply pipe 61, valve 62, MFC 63, valve 64, and the first process gas supply source 65 of the first process gas supply line; and the second gas supply pipe 71, valve 72, MFC 73, valve 74, and the second process gas supply source 75 of the second process gas supply line.

A chlorosilane gas such as dichlorosilane gas ($SiH_2Cl_2$, hereinafter called "DCS") is used as the first process gas.

An ammonia ($NH_3$) gas for example is used as the second process gas.

As shown in FIG. 1, a gas flow rate control unit 80 connects electrically by way of an electrical wire 81 to the first gas supply section 59 (more specifically, the MFC 43, MFC 53) and the second gas supply section 79 (more specifically, the MFC 63, MFC 73).

The gas flow rate control unit 80 controls the supplied gas (first process gas, second process gas) at a desired timing to flow at the desired rate.

The gas flow rate control unit 80 also connects electrically by way of the electrical wire 81 to the MFC 47, 57 installed on the inert gas line in the first gas supply section 59 for controlling the flow rate of inert gas, and to the MFC 67, 77 installed on the inert gas line in the second gas supply section 79 for controlling the flow rate of inert gas.

The gas flow rate control unit 80 controls the supplied inert gas at a desired timing to flow at the desired rate.

The gas flow rate control unit 80 also electrically connects to the valve 42, valve 44, valve 52, and the valve 54 of the first gas supply section 59, and to the valve 62, valve 64, valve 72, and the valve 74 of the second gas supply section 79.

The gas flow rate control unit 80 controls the timing for opening and closing each of the valves, or in other words, the timing for starting/stopping the flow of the gas (first process gas, second process gas).

The gas flow rate control unit 80 also electrically connects to the valve 46, valve 56, valve 48, and the valve 58 installed on the inert gas supply line in the first gas supply section 59, and to the valve 66, valve 76, valve 68, and the valve 78 installed on the inert gas supply line in the second gas supply section 79.

The gas flow rate control unit 80 controls the timing for opening and closing each of the valves, or in other words, the timing for starting/stopping the flow of the inert gas.

As shown in FIG. 1 and FIG. 2, a first exhaust port 90 for exhausting the atmosphere within the processing chamber 34 is installed on the upper manifold 37. A first exhaust pipe 91 connects to the first exhaust port 90.

A pressure sensor 92 functioning as a pressure detector, an exhaust valve 93, and a conductance valve 94 serving as a pressure adjuster valve are installed on the lower flow side which is opposite the side connecting to the first exhaust port 90 of the upper manifold 37 of the first exhaust pipe 91.

A second exhaust port 95 for exhausting the atmosphere within the processing chamber 34 is installed on the lower manifold 35 in the same way. A second exhaust pipe 96 connects to the second exhaust port 95.

A pressure sensor 97 functioning as a pressure detector, an exhaust valve 98, and a conductance valve 99 serving as a pressure adjuster valve are installed on the lower flow side which is opposite the side connecting to the second exhaust port 95 of the lower manifold 35 of the second exhaust pipe 96.

The first exhaust pipe 91 and the second exhaust pipe 96 merge into a single piece farther downstream than the conductance valve 94 and the conductance valve 99. A vacuum pump 101 is connected to a single piece third exhaust pipe 100.

The vacuum pump 101 exhausts the processing chamber 34 to a specified pressure (vacuum intensity) by way of the first exhaust pipe 91, second exhaust pipe 96 and the third exhaust pipe 100.

A pressure control unit 102 electrically connects by way of an electrical wire 103 as shown in FIG. 1, to the conductance valves 94, 99 and the pressure sensors 92, 97.

The pressure control unit 102 adjusts the conductance valves 94, 99 at a desired timing, based on the pressure detected by the pressure sensors 92, 97 so that the pressure inside the processing chamber 34 reaches a desired pressure.

The pressure control unit 102 for example, adjusts the conductance valve 94 based on the pressure detected by the pressure sensor 92 in a state where the exhaust valve 98 of the second exhaust pipe 96 is closed and the exhaust valve 93 of the first exhaust pipe 91 is open, to control the pressure inside the processing chamber 34 at a desired timing to reach a desired pressure.

Moreover, the pressure control unit 102 adjusts the conductance valve 99 based on the pressure detected by the pressure sensor 97 in a state where the exhaust valve 93 of the first exhaust pipe 91 is closed and the exhaust valve 98 of the second exhaust pipe 96 is open, to control the pressure inside the processing chamber 34 at a desired timing to reach a desired pressure.

A temperature sensor functioning as a temperature detector not shown in the drawing is installed inside the process tube 33. A temperature control unit 82 is electrically connected by an electrical wire 83 to the temperature sensor and to the heater 32. This temperature control unit 82 adjusts the electrical supply to the heater 32 based on the temperature information detected by the temperature sensor, to control the temperature inside the processing chamber 34 at a desired timing to reach a desired temperature distribution.

The drive control unit 25, the gas flow rate control unit 80, the temperature control unit 82, and the pressure control unit 102 also make up an operating unit, and input/output unit, and electrically connect to a main control unit 104 for controlling the entire CVD apparatus. A controller 105 is made up of the drive control unit 25, the gas flow rate control unit 80, the temperature control unit 82, the pressure control unit 102 and the main control unit 104.

The film-forming process of the IC production method of an embodiment of the present invention is described next, for the case where forming a thin film on the wafer by the CVD method using the CVD apparatus as described above.

In the following description, the controller 105 controls the operation of each unit making up the CVD apparatus.

After charging multiple wafers 1 into the boat 20, the boat elevator 13 raises the boat 20 holding the multiple wafers 1 as shown in FIG. 2 and the boat 20 is loaded into the processing chamber 34.

In this state, the seal cap 15 seals the bottom end of the lower manifold 35 by way of the O-ring 15a.

Next, the exhaust valve 98 of the second exhaust pipe 96 is closed, the exhaust valve 93 of the first exhaust pipe 91 is opened, and the exhaust pump 101 evacuates the interior of the processing chamber 34 by way of the first exhaust pipe 91 to reach a specified pressure (vacuum intensity).

The pressure sensor 92 of the first exhaust pipe 91 at this time measures the pressure inside the processing chamber 34, and the conductance valve 94 of the first exhaust pipe 91 is feedback-controlled based on the pressure measured by the pressure sensor 92.

At this time, the exhaust valve 93 of the first exhaust pipe 91 may be closed, and the exhaust valve 98 of the second exhaust pipe 96 opened, and the exhaust may be performed by way of the second exhaust pipe 96.

The pressure sensor 97 of the second exhaust pipe 96 at this time measures the pressure inside the processing chamber 34, and the conductance valve 99 of the second exhaust pipe 96 is feedback-controlled based on the measured pressure.

Both the exhaust valve 93 of the first exhaust pipe 91 and the exhaust valve 98 of the second exhaust pipe 96 may be opened, and the exhaust may be performed by way of both the first exhaust pipe 91 and the second exhaust pipe 96.

At this time at least one of the pressure sensor 92 of the first exhaust pipe 91 and the pressure sensor 97 of the second exhaust pipe 96 measures the pressure inside the processing chamber 34. At least one of the conductance valve 94 of the first exhaust pipe 91 and the conductance valve 99 of the second exhaust pipe 96 is feedback-controlled based on the measured pressure.

The pressure adjustment within the processing chamber 34 is carried out while at least one of the first gas supply section 59 and the second gas supply section 79 supplies inert gas into the processing chamber 34.

The heater 32 heats the interior of the processing chamber 34 to reach the desired temperature. Feedback control by way of electrical power conductance is applied to the heater 32 based on the temperature information detected by the temperature sensor so that no temperature gradient forms, or in other words so that the temperature gradient reaches a flat state in at least the wafer group array area (wafer loading area of the boat) within the processing chamber 34.

Thus, the wafers arrayed perpendicularly at equidistant spaces in a horizontal state within the processing chamber 34 are heated to the same temperature across the entire length of the boat 20.

Then, the swivel mechanism 16 rotates the boat 20 to rotate the wafers 1.

Figure 3:
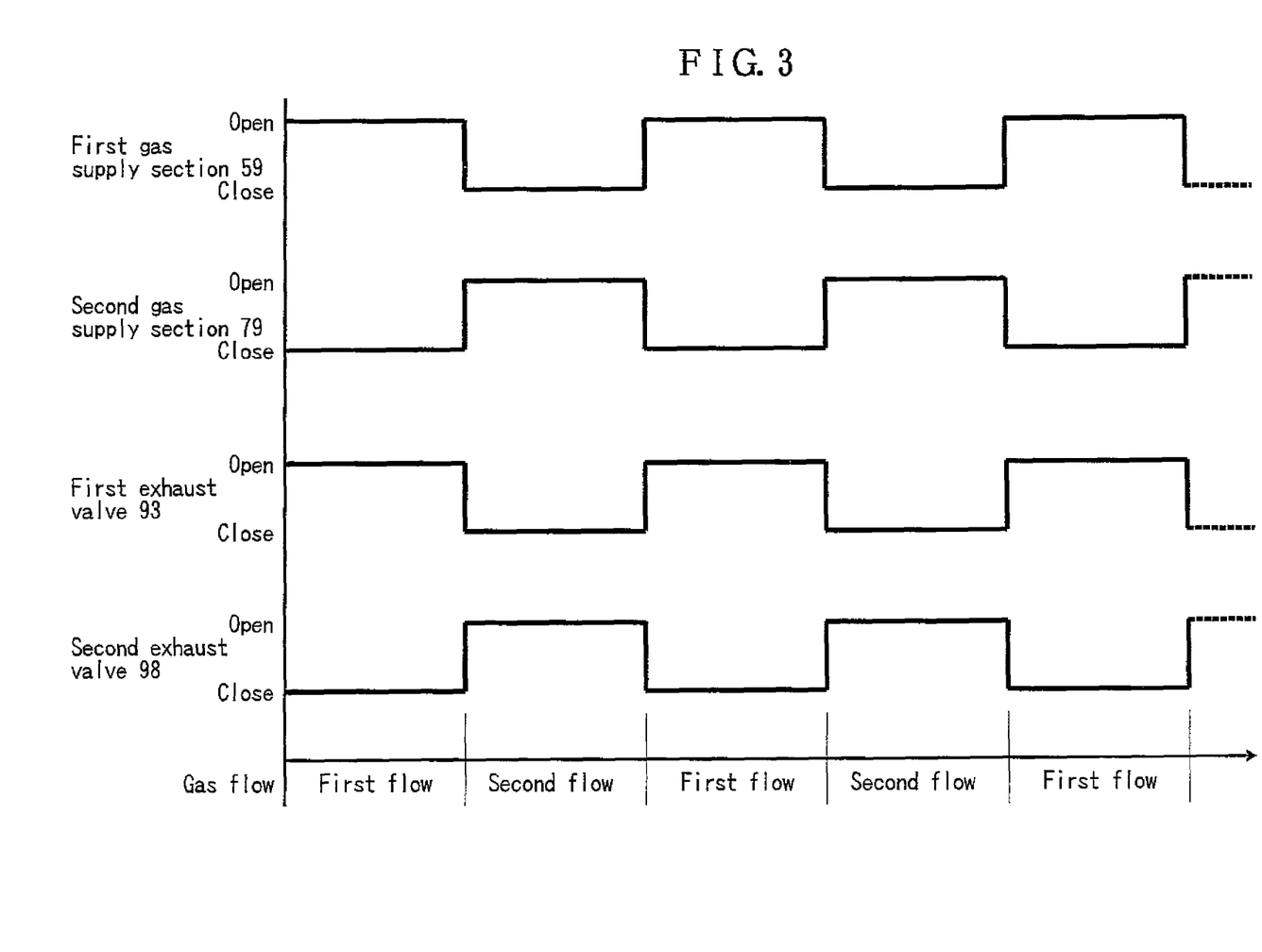
FIG. 3 is a timing chart for showing the gas supply sequence.

Next, the second gas supply section 79 (more specifically, the valves 62, 64, 72, and 74), and the exhaust valve 98 of the second exhaust pipe 96 are closed according to the sequence shown in FIG. 3.

In this state, the first gas supply section 59 (more specifically, the valves 42, 44, 52, and 54), and the exhaust valve 93 of the first exhaust pipe 91 are opened.

Thus, the first process gas supply source 45 of the first gas supply section 59 supplies the first process gas (DCS gas), and the second process gas supply source 55 supplies the second process gas (ammonia gas). The first process gas and the second process gas controlled by the MFC 43, 53 to the desired flow rate, flow through the first gas supply pipe 41 and the second gas supply pipe 51, and are supplied from the first lower nozzle 40 and the second lower nozzle 50 into the processing chamber 34.

The supplied gas rises within the processing chamber 34 from inside the lower manifold 35 and is exhausted from the first exhaust port 90 and the first exhaust pipe 91 installed in the upper manifold 37 (first flow).

The valves 66, 68, 76, and 78 of the inert gas supply pipes 61A, 71A of the second gas supply section 79 are opened at this time, and the second gas supply section 79 supplies the inert gas. This supplied inert gas then flows through the gas supply pipes 61, 71, and is supplied from the first upper nozzle 60 and the second upper nozzle 70 into the processing chamber 34.

While passing through the interior of the processing chamber 34, the first process gas and the second process gas make contact with the surface of the wafer 1, and a thin film at this time is formed on the surface of the wafer 1 due to the thermal CVD reaction.

The pressure sensor 92 installed in the first exhaust pipe 91 at this time measures the pressure inside the processing chamber 34. The conductance valve 94 installed in the first exhaust pipe 91 is feedback-controlled based on the measured pressure to adjust the pressure inside the processing chamber 34.

The gas flow is switched as shown in FIG. 3, when a preset processing time elapses.

Namely, the supply of the first process gas and the second process gas from the first gas supply section 59 is stopped by shutting off the first gas supply section 59 (more specifically, the valves 42, 44, 52, and 54), and closing the exhaust valve 93 of the first exhaust pipe 91.

The second gas supply section 79 (more specifically, the valves 62, 64, 72, and 74) is opened, and the exhaust valve 98 of the second exhaust pipe 96 is opened while in this state.

Thus, the first process gas supply source 65 of the second gas supply section 79 supplies the first process gas, and the second process gas supply source 75 supplies the second process gas. The first process gas and the second process gas whose flow is controlled by the MFC 63, 73 to the desired flow rate, flow through the first gas supply pipe 61 and the second gas supply pipe 71, and are supplied from the first upper nozzle 60 and the second upper nozzle 70 into the processing chamber 34.

The supplied gas descends within the processing chamber 34 from inside the upper manifold 37, and is exhausted from the second exhaust pipe 96 and the exhaust port 95 installed in the lower manifold 35 (second flow).

The valves 46, 48, 56, and 58 of the inert gas supply pipes 41A, 51A of the first gas supply section 59 are opened at this time and the first gas supply section 59 supplies the inert gas. This supplied inert gas flows through the first gas supply pipe 41 and the second gas supply pipe 51 and is fed into the processing chamber 34 from the first lower nozzle 40 and the second lower nozzle 50.

While passing through the interior of the processing chamber 34, the first process gas and the second process gas make contact with the surface of the wafer 1, and a thin film at this time is formed on the surface of the wafer 1 due to the thermal CVD reaction.

The pressure sensor 97 installed in the second exhaust pipe 96 at this time measures the pressure inside the processing chamber 34. The conductance valve 99 installed in the second exhaust pipe 96 is feedback-controlled based on the measured pressure to adjust the pressure inside the processing chamber 34.

One cycle or multiple cycles are performed to form the film having a desired thickness with the one cycle including: a film forming utilizing a first flow from the lower section towards the upper section within the processing chamber 34, and a film forming utilizing a second flow from the upper section towards the lower section within the processing chamber 34.

This cycle is preferably repeated multiple times in view of the need to improve film thickness uniformity among wafers.

After the above described cycle is performed for the preset number of times and a thin film with the desired thickness is formed, the first gas supply section 59 (more specifically, the valves 42, 44, 52, and 54) and the second gas supply section 79 (more specifically, the valves 62, 64, 72, and 74) are closed.

Moreover, inert gas is supplied from the inert gas supply line of at least one among the first gas supply section 59 and the second gas supply section 79 and preferably is supplied from the inert gas supply lines of both, replacing the atmosphere in the processing chamber 34 with inert gas and returning the pressure in the processing chamber 34 to normal pressure.

The boat elevator 13 then lowers the seal cap 15, and along with opening the bottom end of the lower manifold 35, the boat 20 holding the processed wafers 1 is unloaded from the bottom end of the lower manifold 35 to outside the process tube 33.

The processed wafers are next discharged from the boat 20.

Conditions for processing the wafers 1 in the processing furnace of this embodiment to form a $Si_3N_4$ film are for example a processing temperature of 700 to 800 degrees C., a processing pressure of 10 to 100 Pa, a DCS gas flow rate of 5 to 500 sccm, a $NH_3$ gas flow rate of 5 to 2000 sccm, and a number of cycles from 1 to 50. The wafers are processed while maintaining each of the processing conditions at a fixed value within each specified range.

Figure 4A:
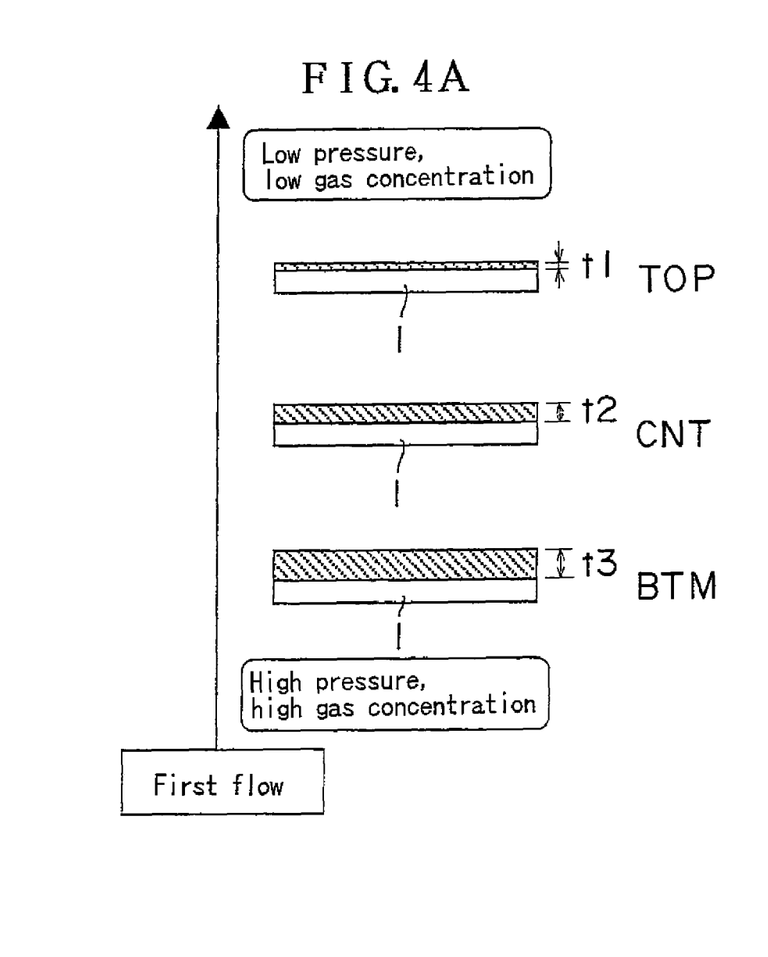
FIG. 4A is a drawing for describing the phenomenon for switching the gas flow.
Figure 4B:
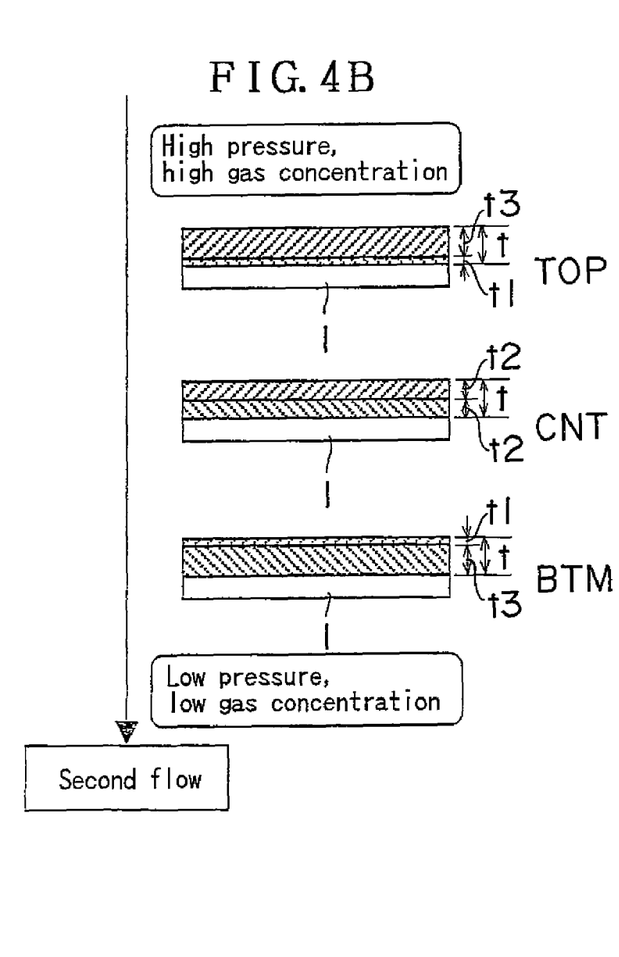
FIG. 4B is a drawing for describing the phenomenon for switching the gas flow.

Alternating the first flow and the second flow of film forming gas (DSC gas and ammonia gas) without forming a temperature gradient within the processing chamber 34 as described above causes the phenomenon shown in FIG. 4 in the processing chamber 34.

As shown in FIG. 4A, a first flow of film forming gas from the bottom side (hereinafter called "BTM") of the processing chamber 34 by way of the center section (hereinafter called "CNT") of the processing chamber 34, towards the top side (hereinafter called "TOP") of the processing chamber 34 forms a film where:

the BTM side pressure becomes larger than the TOP side pressure, the BTM side gas concentration becomes larger than the TOP side gas concentration, and the BTM side film thickness is larger than the TOP side film thickness.

For example, when a film with a film thickness t1 is formed on the wafer 1 positioned on the TOP side, a film with a film thickness t2 is formed on the wafer 1 positioned on the CNT side, and a film with a film thickness t3 is formed on the wafer 1 positioned on the BTM side, then t1<t2<t3.

Then as shown in FIG. 4B, a second flow of film forming gas from the TOP side by way of the CNT side towards the BTM side forms a film where:

the TOP side pressure becomes larger than the BTM side pressure, the TOP side gas concentration becomes larger than the BTM side gas concentration, and the TOP side film thickness is larger than the BTM side film thickness.

Namely, a film with a film thickness t3 is formed on the film with a film thickness t1 formed on the wafer 1 on the TOP side;

A film with a film thickness t2 is formed on the film with a film thickness t2 formed on the wafer 1 on the CNT side, a film with a film thickness t1 is formed on the film with a film thickness t3 formed on the wafer 1 on the BTM side (t1<t2<t3).

The total film thickness t formed on the wafer 1 on the TOP side in this way becomes t1+t3;

the total film thickness t formed on the wafer 1 on the CNT side becomes t2+t2;

the total film thickness t formed on the wafer 1 on the BTM side becomes t3+t1, and the total film thickness t for film formed on each wafer 1 is then equivalent at each position. So that t=t1+t3 (TOP side)=t2+t2 (CNT side)=t3+t1 (BTM side).

As clearly shown from the total film thickness for each wafer 1 at each position shown in FIG. 4B, if the film forming utilizing the first flow and the film forming utilizing the second flow set as one cycle and if this cycle is performed at least one time or more, then the difference between the TOP side wafer film thickness and the BTM side wafer film thickness caused by film forming from the first flow, can be canceled out by the film forming from the second flow so that a uniform film thickness can be achieved among the wafers.

No temperature gradient is formed in the above described cycle film-forming within the processing chamber 34 so that there is no difference in film quality between the BTM side wafer film quality and the CNT side wafer film quality and the TOP side wafer film quality. In other words, film quality or in other words, the film refractive index and the etching rate among the wafers can be made uniform.

An interface however might be possibly formed at the switching time of the above gas flow.

However, the forming of an interface between the thin film formed by the first flow and the thin film formed by the second flow can be prevented, by continually supplying ammonia gas to flow into the processing chamber with no stoppages when switching the flow of the film forming gas from the first flow to the second flow, or switching the flow from the second flow to the first flow. In other words, one continuous thin film can be formed.

The purge performed between the first flow and the second flow or between the second flow and the first flow is in other words preferably performed under an ammonia gas atmosphere.

Inert gas and ammonia gas may be utilized for the purge, or just ammonia gas may be used.

In this embodiment, when the first process gas is DCS gas and the second process gas is ammonia gas, ammonia gas continuously flows into the processing chamber 34 with no stoppages when switching the flow of gas from the first flow to the second flow, by closing the valves 42, 44 of the first gas supply pipe 41 in the first gas supply section 59, but not closing the valves 52, 54 of the second gas supply pipe 51.

Conversely when switching the flow of gas from the second flow to the first flow, ammonia gas continuously flows into the processing chamber 34 with no stoppages, by closing the valves 62, 64 of the first gas supply pipe 61 in the second gas supply section 79 but not closing the valves 72, 74 of the second gas supply pipe 71.

During the film forming, ammonia gas is preferably continuously supplied from either of the second gas supply pipes 51, 71 of the first gas supply section 59 and the second gas supply section 79.

Figure 5:
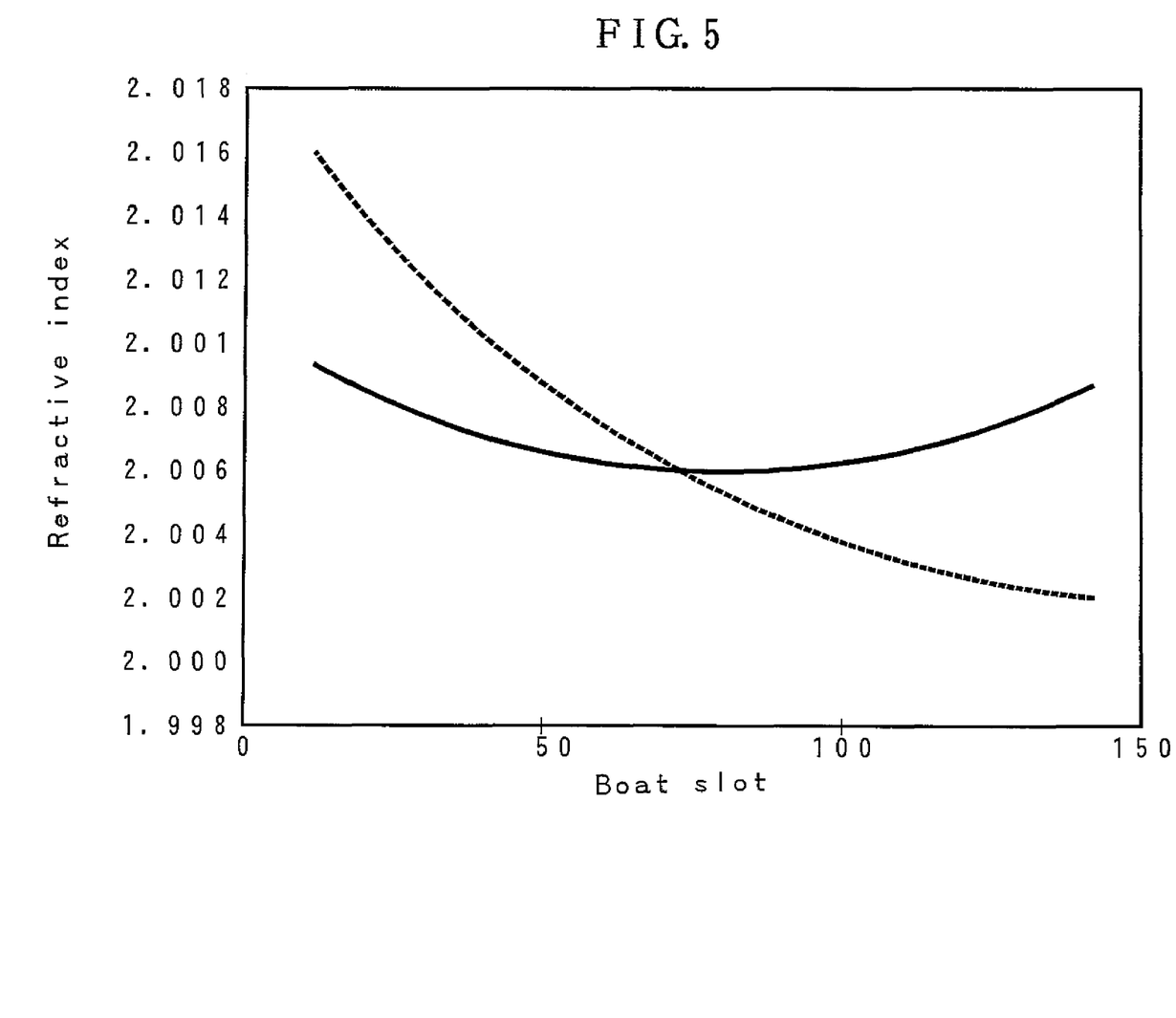
FIG. 5 is a graph for showing the equalizing effect among the wafers for the refractive index of the film.

FIG. 5 is a graph showing the equalizing effect on the film refractive index among the wafers when forming film by the method of this invention, and when forming film by the conventional method.

In FIG. 5, the refractive index is shown on the vertical axis, and the positions of the slots holding the wafers in the boat are shown in the horizontal axis.

The broken line curve shows the conventional example and the solid line curve shows the case of this embodiment.

The refractive index is for a silicon nitride film formed on a wafer, using dichlorosilane gas and ammonia gas.

As clearly shown in FIG. 5, compared to the conventional art, the present embodiment is capable of improving the refractive index uniformity among the wafers.

The present invention is not limited to the above described embodiments and all manner of variations or adaptations not departing from the scope or spirit of the present invention are permitted.

The present invention for example is not limited to forming an $Si_3N_4$ film using DCS ($SiH_2Cl_2$) gas and $NH_3$ gas, but can also apply to when forming an $Si_3N_4$ film using chlorosilane gas such as TCS ($SiHCl_3$), HCD ($Si_2Cl_6$); or when forming an $Si_3N_4$ film using a hydrazine gas such as $N_2H_4$, etc.

Besides the forming of $Si_3N_4$ film, the present invention can also apply to general cases when forming films by the CVD method such as when forming HTO ($SiO_2$) film.

The CVD apparatus of this invention is not limited to a batch type vertical hot wall CVD apparatus, and may also apply to other CVD apparatus such as horizontal type hot wall CVD apparatus, etc.

The case where processing wafers was described in the embodiment but the present invention may also apply to cases where the substrates for processing are liquid crystal panels, photo masks, printed wiring circuit boards, compact disks and magnetic disks, etc.

The invention claimed is:

1. A semiconductor device manufacturing method comprising a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle having sequential steps including a first step of flowing the film forming gas from one end towards the other end along the substrate array direction, and a second step of flowing the film forming gas from the other end towards the one end along the substrate array direction, without forming temperature gradient along the substrate array direction in the processing chamber.

2. A semiconductor device manufacturing method comprising a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle including a step of flowing the film forming gas from one end towards the other end along the substrate array direction, and a step of flowing the film forming gas from the other end towards the one end along the substrate array direction, without forming temperature gradient along the substrate array direction in the processing chamber, further comprising a purge step of purging the interior of the processing chamber between the step of flowing the film forming gas from the one end towards the other end along the substrate array direction, and the step of flowing the film forming gas from the other end towards the one end along the substrate array direction, wherein the film forming gas contains dichlorosilane gas and ammonia gas, and the purge step is performed under an ammonia gas atmosphere.

3. A semiconductor device manufacturing method comprising a process of forming a film on each of multiple substrates arrayed in a processing chamber by a thermal CVD method by supplying a film forming gas into the processing chamber while heating the interior of the processing chamber, wherein in the film forming process, a cycle is performed one time or multiple times with one cycle including a step of flowing the film forming gas from one end towards the other end along the substrate array direction, and a step of flowing the film forming gas from the other end towards the one end along the substrate array direction, without forming temperature gradient along the substrate array direction in the processing chamber, wherein the film forming gas contains dichlorosilane gas and ammonia gas, and ammonia gas is supplied continuously without stopping, while switching the flow of the film forming gas from the one end towards the other end along the substrate array direction, to the flow from the other end towards the one end along the substrate array direction, or switching the flow of the film forming gas from the other end towards the one end along the substrate array direction, to the flow from the one end towards the other end along the substrate array direction.

* * * * *